United States Patent [19]

Ovshinsky et al.

[11] Patent Number: 5,102,860

[45] Date of Patent: Apr. 7, 1992

[54] METHOD OF FLUORINATING A CERAMIC OXIDE WHICH INCLUDES AT LEAST ONE SUPERCONDUCTING PHASE

[75] Inventors: Stanford R. Ovshinsky, Bloomfield Hills; Rosa Young, Troy, both of Mich.

[73] Assignee: Ovonic Synthetic Materials Company, Inc., Troy, Mich.

[21] Appl. No.: 77,840

[22] Filed: Jul. 27, 1987

[51] Int. Cl.$^5$ .................... H01L 39/12; C23C 16/56
[52] U.S. Cl. ........................ 505/1; 505/742; 505/780; 427/62
[58] Field of Search .............. 505/1, 742, 780; 427/62, 377

[56] References Cited

PUBLICATIONS

Politis et al, "Preparation and Superconducting Properties of $La_{1.8}Sr_{0.2}CuO_4$ and $YBa_2Cu_5O_{6.5}$", MRS Extended Abstracts, High Temperature Superconductors, Apr. 23, 1987, pp. 141–144.

*Primary Examiner*—Shrive Beck
*Assistant Examiner*—Margaret Burke
*Attorney, Agent, or Firm*—Marvin S. Siskind

[57] ABSTRACT

A method of controllably introducing a parametric modifier into a perovskite ceramic defect oxide type superconducting material, said method including the substitution of labile atoms of a parametric modifier (such as fluorine) for atoms already present in the ceramic defect oxide material.

10 Claims, 2 Drawing Sheets

$M_V^{IIA} M_W^{IIIA} M_X^{IB} O_Y$
SHOWING OXYGEN SITES AND VACANCIES

○ = O
● = Cu
⊗ = VACANCY

METHOD OF FLUORINATING A CERAMIC OXIDE WHICH INCLUDES AT LEAST ONE SUPERCONDUCTING PHASE

FIELD OF THE INVENTION

The instant invention relates generally to the newly discovered class of ceramic defect oxide type of superconducting materials and more specifically to the newly discovered high transition temperature class of superconducting materials fabricated so as to have the general composition $M^{IIA}M^{IIIA}M^{IB}O$; where MIIA is a Group IIA metal, $M^{IIIA}$ is a Group IIIA metal, and $M^{IB}$ is a Group IB metal. The instant inventors disclose herein a method of exchanging, in controllable percentages, labile atoms of a parametric modifier for atoms present in said superconducting material, so as to raise the transition temperature, alter the oxidation state of the Group IB metal, increase the stability, and/or beneficially effect the superconducting phases of the ceramic defect oxide type material in which it is incorporated.

BACKGROUND OF THE INVENTION

The accomplishment of attaining high-temperature superconductivity is of immense scientific and technological importance. Several critical transition temperature barriers have been breached since the long-standing record temperature of 23.2 Kelvin for $Nb_3Ge$ was exceeded. However, the ultimate benchmark of room temperature superconductivity remained an unattainable goal until the instant inventors successfully introduced atoms of a parametric modifier into a class of ceramic defect oxide type superconducting materials (described in detail hereinafter) so as to form a new, high critical temperature class of superconducting materials.

In late 1986, the superconducting properties of certain ceramic defect oxide type materials, which materials are variations of a well-known class of inorganic structures called perovskites, were observed by Bednorz and Mueller. The Bednorz and Mueller work was based upon materials developed by Michel and Raveau. The materials which Bednorz and Mueller observed contained lanthanum, barium, copper, and oxygen, and were reported to be superconducting at a temperature of about 30 degrees Kelvin.

Subsequently, many workers in the field became involved in efforts that resulted in the increase of the critical temperature, $T_c$, (the temperature at which electrons are able to move through a material without encountering any resistance to that motion) by the substitution of yttrium for lanthanum. Upon analysis, the superconducting composition was found to be a perovskite defect oxide of the $Y_1Ba_2Cu_3O_y$ type, possibly an orthorhombically distorted perovskite. This composition has also been referred to as a tetragonal, square-planar structure with the $Y_1Ba_2Cu_3O_y$ defect oxide perovskite phase being responsible for the superconducting properties. Further work with this high $T_c$ phase effectively raised the critical temperature thereof to a few degrees above 90 degrees Kelvin (a temperature above the atmospheric boiling point of liquid nitrogen).

However, up to this point in time, scientists in the field had been unable to raise the temperature of superconducting materials to the temperature of the environment, i.e., room temperature. More particularly, prior to the work of the instant inventors at the laboratory at Energy Conversion Devices, Inc., three plateaus in raising the critical temperature of superconducting materials had been broached. The first plateau was represented by the pre-ceramic defect oxide type superconducting materials which materials were limited to a $T_c$ of about 23-25 Kelvin; the second plateau was represented by the work of Bednorz and Mueller on lanthanum, barium, copper and oxygen systems, which systems resulted in superconducting temperatures of about 30 degrees Kelvin; and the third plateau was represented by the yttrium, barium, copper and oxygen systems, which systems provided for a rise in critical temperature to about 90-95 degrees Kelvin. However, it was not until the aforementioned new class of parametrically modified, fluorinated, superconducting materials were developed by Energy Conversion Devices, Inc. that the crucial benchmark of room temperature superconducting appeared to be attainable.

Later workers in the field have attempted the total and/or partial replacement of the yttrium and/or lanthanum with other Group IIIA metals (including Rare Earth elements), especially with scandium, europium, lutetium, neodymium, praseodymium, and gadolinium. The same and other workers in the field have also attempted the total and/or partial replacement of barium with other group IIA metals, as strontium and calcium.

The defect oxide perovskite phase, having the general composition $M_1^{IIIA}M_2^{IIA}M_3^{IB}O_y$, was identified by several groups utilizing electron microprobe analysis, x-ray diffraction, scanning electron microscopy, neutron scanning and transmission electron microscopy. These groups have independentally characterized this defect oxide perovskite, $M_1^{IIIA}M_2^{IIIA}M_3^{IB}O_y$ A phase as having the crystallographic unit cell structure shown in FIG. 1.

The perovskite structure is similar to the naturally occurring calcium titanate structure, $CaTiO_3$, also shown by other $AB_2O_3$-type oxides having at least one cation much larger then the other cation or cations, including the tungsten bronzes, $NaWO_3$, strontium titanate, barium titanate, $YAlO_3$, $LaGaO_3$, $NaNbO_3$, $KNbO_3$, $KMgF_3$, $KNiF_3$, and $KZnF_3$, among others. In the perovskite structure the larger ions ($La^{+3}=1.15$ angstroms, $Ba^{+2}=r$ 1.35 angstroms, and $0^{+2}=1.40$ angstroms, Linus Pauling, *The Nature of the Chemical Bond*, 3rd Edition, Table 13-3, "Crystal Radii and Univalent Radii of Ions") form a cubic close packed structure, with the smaller ions ($Cu^{+2}=0.96$ angstroms, $Y^{+3}=0.90$ angstroms, Pauling, op. cit.) arranged in occupying octahedral interstices in an ordered pattern. Together they form a cubic close packed (face centered cubic) array.

The superconducting perovskite type materials are ceramic defect oxides. That is, the superconducting phases of the perovskite type materials are solids in which different kinds of atoms occupy structurally equivalent sites; where, in order to preserve electrical neutrality, some sites are unoccupied or vacant. Since these vacancies can be filled with mobile oxygen atoms, local order is prevalant. It is also clear that these vacant atoms form lattice defects, which defects have, generally, profound affects on the electrical parameters of the material and, more particularly profound affects on the oxidation states of the copper atoms.

In order to achieve yet higher critical temperatures, researchers at Energy Conversion Devices, Inc. realized that it would be necessary to develop a truly electronic material in which the chemistry thereof was engineered so as to alter the local chemical and electrical environment. For example, and as mentioned hereinabove, it has been established that the mobility of oxygen atoms in the $Y_1Ba_2Cu_3O_7$-type materials is very high and therefore the location of those mobile oxygen vacancies at any point in time contribute to the variations in the local electronic environment. It is this oxygen mobility and changing local environment which results in the unstable electronic properties of this class of superconducting materials. Therefore, one task (the importance of which cannot be overemphasized) established by the instant inventors and emphasized herein was the stabilization of oxygen mobility in high transition temperature phases of the superconducting material.

The structure shown in FIG. 1 has a recurring structure of (1) a $M^{IB}$-0 plane of a first type with vacant 0 sites, (2) a $M^{IIA}$-0 plane, (3) a $N^{IB}$-0 plane of a second type with fully occupied 0 sites, (4) a $M^{IIIA}$ plane with 0 sites, (5), another $M^{IB}$-0 plane of the first type with fully occupied 0 sites, (6) another plane of the $M^{IIA}$-0 type, and a (7) a second $M^{IB}$-0 plane of the first type, with 0 site vacancies. It may thus be seen that the unit cell (of the superconducting material) so formed has seven planes spacedly disposed along the c axis thereof.

The central plane is a plane of the $M^{IIIA}$-0 type, as a Y-0 or La-0 plane, with the Group IIIA metal being surrounded at its four coplanar corners by oxygen sites, which may be occupied or vacant. Immediately above and below this $M^{IIIA}$-0 plane are equivalent $M^{IB}$-0 planes of the second type, i.e., Cu-0 planes, with the Group IB metal ions being at the four corners of the plane, and occupied oxygen sites being along each edge of the planes. These square planar $M^{IB}$ atoms (or ions), each surrounded by four oxygen atoms (or ions) have been reported to be critical to superconductivity in the. defect oxide perovskites. A pair of $M^{IIA}$-0 planes, as Ba-0 planes lie atop and below these fully occupied first type $M^{IB}$-0 planes. The $M^{IIA}$-0 planes, formed with the Group IIA metal, as barium, at the center have fully occupied oxygen sites, with the oxygens disposed directly above and below the Group IB metal sites of the adjacent planes. The $M^{IIA}$-0 planes are disposed between $M^{IB}$-0 planes, as shown in FIG. 1, with the first type $M^{IB}$-0 planes disposed on opposite sides thereof relative to the second type $M^{IB}$-0 planes. As mentioned above, the deficiencies, that is, the vacancies (unoccupied sites) reported to reside in the first type $M^{IB}$-0 planes are the result of the requirement of electrical neutrality. While the vacancies are generally reported to be in the $M^{IB}$-0 planes, they may also be in the other planes, as in the $M^{IIA}$-0 planes and/or in the $M^{IIIAl}$-0 planes.

While the aforementioned researchers have been responsible for the developments which occurred over the course of the last several months in raising the critical temperature of the aforementioned classes of superconducting materials up to about 90 degrees Kelvin; it was not until the work of the instant inventors that the critical temperature of the high $T_c$ phases of said superconducting material has been raised beyond about the 90–98 degree Kelvin plateau. More particularly, the instant inventors have previously provided evidence (in the commonly assigned application referred to the following paragraph) of superconducting phases with transition temperature as high as 155 to 168 degrees Kelvin at which temperatures a zero resistance state has been measured through the use of "modification" techniques. These materials also gave magnetic indication of the presence of yet higher temperature superconducting phases of said superconducting material. In addition, electrical conducting measurements reveal the "modified" superconducting materials of the instant inventors achieved a resistance value approximately four times lower than that of single-crystal copper before the zero-resistance state thereof is reached. This is taken as clear evidence for the presence of same volume fraction of other higher transition superconducting phases. It is also essential to note that recent magnetic measurements of the modified superconducting material indicate superconducting phases as high as about 370 degrees Kelvin.

The inventors of the instant invention, while working with the perovskite, ceramic defect oxide class of superconducting materials, have previously been successful in introducing at least one "parametric modifier" into the unit cell thereof so as to improve the superconducting properties of that class of superconducting materials. This introduction of parametric modifier elements through the use of "shake and bake" powder metallurgical process was fully disclosed in commonly assigned, copending U.S. application Ser. No. 043,279, filed Apr. 27, 1987 by Stanford R. Ovshinsky and Rosa Young entitled "Parametrically Modified Superconducting Material", the disclosure of which is incorporated herein by reference. The incorporation of the parametric modifier into the superconducting phases resulted in overcoming what had appeared to be a barrier to raising the critical temperatures of superconducting material to additional heights. It was in this way that *Ovshinsky, et al* provided a new mechanism for affecting fundamental parameters of said superconducting materials, which parameters determine the critical temperature thereof. It was also in this manner that the door was opened for further increases in critical temperatures of superconducting materials, even beyond the 155–168 degree Kelvin temperatures reported in said *Ovshinsky, et al* application. More specifically, the addition of the parametric modifier, fluorine, to the superconducting material resulted in the identification of a superconducting phase of said defect oxide type superconducting material which has recently been shown to achieve a critical temperature at about 90° F. (a temperature well above room temperature) with indications of the presence of yet higher temperature superconducting phases. It should be specifically noted that the significance of room temperature superconductivity is more than a quantative phenomena; said room temperature critical temperature makes possible a host of new applications which were heretofore unattainable.

While the aforementioned introduction of a parametric modifier (such as fluorine) into a superconducting material successfully raised the critical temperature thereof to at least above about 90 degrees F, which "room" temperature superconductivity represented the ultimate goal long sought after by workers in the field; said introduction of the parametric modifier element was accomplished by a mixing and baking powder metallurgical process (see Example I of the instant specification) wherein at least one fluorinated precursor compound was substituted for at least one oxygenated precursor compound. However, the instant inventors discovered that regardless of the nature of the fluorinated precursor compound employed (i.e., whether the introduction was a BaF or aCuF compound), the baking process required such high temperatures so as to effect a solid state reaction which resulted in the preferential formation of new non-superconducting phases in the bulk of the superconducting material. This preferential formation of fluorinated non-superconducting phases not only prevented significant atomic percentages of fluorine, the parametric modifier, from being incorporated so as to form the high $T_c$ phases of the superconducting material; but it also preferentially formed new non-superconducting phases. More specifically, the addition of fluorinated precursors in said powder metallurgical process resulted in the formation of a large atomic fraction of a $BaF_2$ non-superconducting phase due to the solid state reaction which released the barium from the superconducting phase. The barium, having been freed, then acts as a getter of the fluorine, thereby giving rise to said new $BaF_2$ non-superconducting phase.

It was based upon this work that the instant inventors realized (1) significant atomic fractions of new non-superconducting phases of the fluorinated defect oxide type superconducting materials would be preferentially formed and (2) most of the fluorine would be preferentially incorporated into said new non-superconducting phases if typical powder metallurgical processes continued to be employed. Of course, the more fluorine is incorporated into non-superconducting phases, the less fluorine is available to be incorporated into the high $T_c$ phases. These conclusions were due to the preferential formation of said non-superconducting phases at the elevated temperatures required for the solid state powder metallurgical reactions to occur. It was also based upon the aforementioned rationale that the instant inventors developed an "exchange" technique (which technique will be described in detail hereinafter) so as to provide a mechanism for the controllable substitution of large percentages of the labile atoms of the parametric modifier element for constituent atoms of the unit cell of the high $T_c$ superconducting phases of the superconducting material. Additionally, this means of parametric modifier introduction is capable of being employed in low cost, high product throughput manufacturing processes. It also appeared that such an exchange could be effected without the concurrent formation of new, non-superconducting phases. This mechanism is rendered possible by first forming a conventional superconducting material characterized by a relatively high atomic percentage of superconducting phases (such as $Y_1Ba_2Cu_3O_7$) and then exchanging a controllable percentage of labile atoms of a parametric modifier element, such as fluorine, for a controllable percentage of the oxygen atoms thereof. By accomplishing this exchange of fluorine for oxygen at a temperature well *below the solid state reaction temperature* of the yttrium, barium and copper metals, new non-superconducting phases are substantially and kinetically prevented from being formed.

While specific materials will not be disclosed herein, it must be noted that the basic method of exchanging fluorine and oxygen atoms, disclosed in detail hereinafter, can be readily extrapolated so as to provide for the "modulation" and "doping" of other elements within the instant or other superconducting classes of materials. In other words, while, in its most specific sense, the instant invention relates to the controlled substitution of fluorine atoms for oxygen atoms so as to increase the transition temperature or to add stability or to increase the volume fraction of high $T_c$ phases; other elements (such as Y or Ba) of the superconducting phases could be "exchanged" so as to parametrically modify a superconducting related property of the material.

As used herein, the phrase "parametric modifier" refers to the modification of the local environment and/or the local chemistry of the superconducting material in such a manner as to affect one or more parameters which control or impact upon the level of the critical temperature of the superconducting phase. Examples of such control parameters are those related to the BCS model (described in the aforementioned commonly assigned copending U.S. application Ser. No. 043,729), such as Debye Temperature, number of charge carriers above the Fermi sea, coupling constants and parameters related thereto. The Debye temperature, stated in simplified form, is a function of the stiffness of the lattice; however, it is possible that in a superconductive structure of this complexity, an equivalent structural or other mechanism may be operative in affecting the critical temperature. Hence, the term "effective Debye Temperature" will be used hereinafter to refer to a parameter of this general type.

In summary, the parametric modifier thus acts to modify the local chemistry or local environment of the unit cells and/or other structural and chemical configurations from which the superconducting material is fabricated so as to realize changes in the parameters (particularly parameters relative to the oxidation states of the copper atoms or the local electronic environment) affecting the critical temperature. The parametric modifier may also act to affect the interaction between the otherwise shielded orbitals of adjacent atoms of the unit cell, in particular the d orbitals and in some cases the f orbitals as well. The parametric modifier can additionally act to produce changes in certain parameters which are positive in their effects on the critical temperature while at the same time avoiding otherwise related adverse changes in other parameters which would negatively affect the critical temperature. Thus, normally dependent parameters are uncoupled from one another.

Through yet another mechanism, the parametric modifier may act to modify the local electrical environment of the superconducting material so as to provide control of the oxidation states. In this manner, a particular preferred oxidation state for higher critical temperatures of superconducting material may be locked in and/or stabilized.

The local environments in such materials generally include oxygen vacancies which may be viewed as deviations from periodicity or in local order which affect the total interactive environment (TIE). The ability of the modifier to affect such variations from normal structural bonding (NSB) or such deviant electronic configurations (DECs) through modification of the local environment allows manipulation of the critical parameters which affect critical temperature.

It is to be noted that one of the inventors of the subject invention, Mr. Ovshinsky, has previously discussed the coupling and decoupling of various physical properties of superconducting materials by controlling, on a molecular level, the relationship existing between the atoms thereof; however, while applicable to this class of superconducting material, this coupling and decoupling was accomplished for a different class of superconductors and required precision fabrication techniques. See, for example, U.S. Pat. No. 4,520,039, entitled Compositionally Varied Materials And Method For Synthesizing The Materials; U.S. Pat. application Ser. No.

705,241 of the same title; and U.S. Pat. application Ser. No. 026,596 entitled Superconducting Materials. In comparison thereto, the technique for introducing the special parametric modifiers of the instant invention provides for the coupling and decoupling of physical and electrical properties of superconducting materials of the ceramic defect oxide type without the necessity of resorting to complicated fabrication techniques.

Therefore, the instant invention provides a method of controllably exchanging a given preselected percentage of the labile atoms of said parametric modifier for other constituent atoms of a ceramic defect oxide type superconducting material. Evidence is further provided that this exchange can occur without simultaneously introducing non-superconducting phases thereinto.

More particularly, the subject invention discloses a method of exchanging the labile atoms of said parametric modifier for the oxygen atoms of the ceramic oxide type superconducting material in such a manner that the percentage incorporation of labile atoms increases in proportion to the percentage decrease of oxygen atoms released from said material; and conversely the percentage incorporation of labile atoms decrease in proportion to the percentage increase of fluorine atoms from said material. This labile exchange of fluorine atoms for oxygen atoms can result in increased stability, a higher critical temperature and a higher volume fraction of high $T_c$ superconducting phases. It should be noted that fluorine was selected as the labile exchange atom because of its small size and high electronegativity so as to form stronger bonds which lock in desired oxidation states.

These and other objects and advantages of the subject invention will become apparent from the Detailed Description of the Invention, the Drawings and the Claims which follow.

BRIEF SUMMARY OF THE INVENTION

The invention described herein provides a method for exchanging the labile atoms of a parametric modifier for constituent atoms of the unit cell of a perovskite ceramic defect oxide type superconducting material. The labile atoms of the parametric modifier are preferably substituted into the superconducting unit cell through an exchange reaction with the oxygen atoms thereof. The labile atom is typically introduced in activated form by exciting a precursor source, as in a glow discharge plasma, e.g., a microwave glow discharge plasma.

More particularly, there is disclosed herein a method of controllably substituting a preselected percentage of labile atoms of a parametric modifier into a ceramic defect oxide type superconducting material through an exchange reaction, or at least a partial exchange reaction, with the incorporated oxygen, where the ceramic oxide type material includes at least one superconducting phase. The method includes the steps of providing a ceramic defect oxide type material which includes at least one superconducting phase, subjecting the ceramic defect oxide type material to a source of labile atoms of a parametric modifier so as to exchange said labile atoms for atoms already present in the superconducting material, and controllably diffusing the labile atoms of the parametric modifier into the bulk of the material, preferably without the formation of new non-superconducting phases.

The method further includes the step of forming the superconducting phase of the material as $M^{IIA}M^{IIIA}M^{IB}O$ where $M^{IIA}$ is a Group IIA metal, and $M^{IIIA}$ is a Group IIIA metal and $M^{IV}$ is a Group IV metal. Preferably, fluorine atoms are introduced from a precursor source of labile atoms of the parametric modifier element.

The preferred single-phase superconductor has the formula $M_v^{IIA}M_w^{IIIA}M_x^{IB}O_yZ_z$; where $M^{IIA}$ is a Group IIA metal, $M^{IIIA}$ is a Group IIIA metal, $M^{IB}$ is a Group IB metal, Z is a parametric modifier, v is approximately 2, w is approximately 1, x is approximately 3, y is from approximately 5.5 to 9.0, and z is from approximately 0.1 to 2.5. The coefficients on the oxygen, x, and on the fluorine, y, are such as to simultaneously maintain charge neutrality and to provide superconductivity.

The mixed precursor compounds from which the $M^{IIA}$, $M^{IIIA}$, and $M^{IB}$ compound is fabricated, are brought into contact with an oxidizing atmosphere under conditions selected to form the ceramic defect oxide type material characterized by said at least one superconducting phase. Thereafter, the ceramic oxide type superconducting phase is exposed to the source of highly reactive labile atoms, such as fluorine atoms. The labile fluorine atoms may be provided by decomposing a fluorine compound in a glow discharge or microwave plasma. In this manner, the fluorine atoms may be introduced into the superconducting material in volatile form. In the most preferred embodiment, the fluorine is introduced into the plasma as an $NF_3$ precursor compound. In an alternative embodiment, a catalyst, such as platinum, may be utilized to decompose the fluorinated precursor compound. Regardless of the manner in which the fluorinated precursor is formed, it is important to provide said labile atoms in a highly reactive state, such as in free radical form.

The method may include the further steps of controllably grading the concentration of incorporated labile atoms of said parametric modifier from a maximum at the peripheral surface of ceramic defect oxide type superconducting material to a preselected minimum internally thereof. Of course, the concentration of incorporated atoms of said parametric modifier may be controllably graded so as to be constant throughout at least a portion of the bulk of the superconducting phase of said ceramic oxide material. In either case, the superconducting phase of said material may be harvested from a portion of the thickness of the bulk of the superconducting phase of the material.

DETAILED DESCRIPTION OF THE INVENTION

Figure 3:
FIG. 3 is a microphotograph illustrating the exchange of labile fluorine atoms for oxygen atoms of the superconducting material of the instant invention, as that exchange occurs in a graded manner to a sixty micron depth below the surface.
Figure 1:
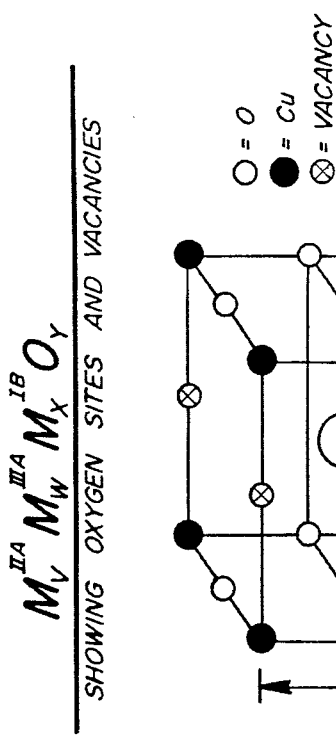
FIG. 1 illustrates the typical unit cell structure of a defect oxide type superconducting material characterized by the composition of $M^{IIB}M^{IIIB}M^{IIA}O$ and particularly depicting the oxygen vacancies present in the CuO planes of that unit cell.

In order to raise the critical temperature of perovskite ceramic defect oxide type superconducting material, i.e., the temperature at which superconductivity or zero resistance movement occurs, there is provided herein a method of fabricating ceramic defect oxide type superconducting material, which material includes a plurality of metal species, oxygen, and labile atoms of a parametric modifier in combined form. The method is characterized by the improvement of controllably substituting labile atoms of the parametric modifier for oxygen atoms of the unit cell of the material at a substantially low temperature and from a precursor, preferably gaseous, highly reactive source thereof. In this way, the instant inventors have made it possible to introduce large atomic percentages of said parametric modifier element into the high $T_c$ superconducting phase of superconducting material through an exchange reaction with the oxygen atoms of said phase. The instant inventors further present herewith evidence that the exchange can occur without the formation of 1; non-superconducting phases (such as $BaF_2$ phases in the case wherein the parametric modifier is fluorine).

According to the invention described herein, labile atoms of the parametric modifier are exchanged with oxygen atoms of the unit cell of the ceramic defect oxide type superconducting material from a precursor source of the parametric modifier. The term "labile atoms", as used herein, means atoms, e.g., fluorine atoms, having the ability to engage in reactions which result in readily and rapidly replacing one or more atoms already present in the structure e.g., oxygen, or in readily adding to the structure. Lability, as used herein, refers specifically to the high kinetic rate of incorporation of the labile atom in the superconducting material, i.e., to the high kinetic rate of the exchange of a labile atom of the parametric modifier for an atom already present in the unit cell of a superconducting phase of the defect oxide type material.

According to the concepts set forth herein, the labile atom is an atom of a parametric modifier element, which parametric modifier elements have been defined hereinabove as materially affecting the superconducting properties of a ceramic defect oxide type material in a beneficial manner. As such, the incorporation of labile atoms must be accomplished in such a manner that the structure of the unit cell of the superconducting phases thereof is not deleteriously distorted and that said introduction does not result in the formation of substantial new non-superconducting phases or of substantially lower $T_c$ superconducting phases which would substantially reduce the atomic percentage of high $T_c$ superconducting phases of the superconducting material.

The labile atoms of the parametric modifier element must be controllably introduced into the unit cell of the superconducting phases of the ceramic defect oxide superconducting material. This is done both to substantially limit the formation of deleterious, non-superconducting or substantially lower $T_c$ superconducting phases, such as $BaF_2$, (in cases wherein fluorine is incorporated as the parametric modifier element). By introducing the parametric modifier in highly activated form, such as in free radical form, the reactivity thereof is optimized and the exchange of, for instance, fluorine free radicals for oxygen atoms in the superconducting phases, is maximized.

The parametric modifier is preferably fluorine. The parametric modifier is introduced as a decomposable gaseous precursor compound, the decomposition of the precursor compound is adapted to yield the activated labile fluorine atoms. Preferred fluorine precursors are covalent, gaseous fluorides. Examples of such covalent gaseous fluoride include, without limitation, $F_2$, HF, $SF_4$, $SF_6$, $NF_3$, $NF_5$, $PF_3$, $PF_5$, and $BF_3$. The method of decomposition may vary and will be further described hereinafter; however, the method must be one which will provide activated atoms of the parametric modifier at temperatures below the temperature at which solid state reactions between the metals of the perovskite ceramic defect oxide type superconducting material will occur.

The superconducting material is a multi-phase ceramic defect oxide type of compound, e.g., having the composition represented by $M^{IIA}M^{IIIA}M^{IB}O_Z$, where $M^{IIA}$ is a group IIA metal, $M^{IIIA}$ is a group IIIA metal, $N^{IB}$ is a group IB metal and Z is the parametric modifier. The aforenoted composition is present in the following proportions: $M_v^{IIA}M_w^{IIIA}M_x^{IB}O_yZ_z$; where $M^{IIA}$ is a Group IIA metal, $M^{IIIA}$ is a Group IIIA metal, $M^{IB}$ is a Group IB metal, Z is a parametric modifier, and wherein v is approximately 2, w is approximately 1, x is approximately 3, y is from approximately 5.5 to 9.0, and generally from 6.0 to 8.0, and z is from approximately 0.1 to 5.0, and in the range of approximately 0.1 to 2.5 or higher. The coefficients on oxygen (x) and fluorine (y) are such as to simultaneously maintain charge neutrality and to provide superconductivity.

According to the disclosed concepts of the instant invention, superconducting materials can be synthesized in a powder metallurgical process which has now been fully described in the art, and subsequent to that process, can be contacted by the activated labile atoms of the parametric modifier element. This may be accomplished by subjecting the ceramic defect oxide type superconducting phases to a source of labile atoms, e.g., a covalent, gaseous fluorine compound, under conditions favorable to decomposing that gaseous source of labile atoms. This may be accomplished through the use of a glow discharge plasma, for example a microwave plasma, or through the use of a catalyst, such as a platinum wire.

The present inventors have found that through the use of the atomic exchange technique set forth herein, superconducting materials (multi-chemical element superconducting materials, including the multi-element, multi-phase superconducting materials of the perovskite defect oxide type) may be formed at low temperatures and in a manner adapted to incorporate a greater concentration of atoms of the parametric modifier element than was previously possible utilizing techniques wherein those atoms were introduced as a precursor powdered compound which was then fired to very high temperatures for initiating a solid state reaction between said precursor mixture of powdered compounds. More specifically, by utilizing a microwave glow discharge, a sample pellet measuring about one centimeter in diameter by about three millimeters in thickness was determined to exchange from 30 atomic percent or more of the labile atoms of the parametric modifier element at the exposed surface for oxygen atoms already present in the superconducting material. This 30 atomic percent was graded to less than 3 atomic percent of the labile atoms of the parametric modifier at a depth of 40 microns into the bulk. The instant inventors have also been able to achieve preselected profiles of those atoms by controlling reaction parameters, such as, time, temperature, pressure, flow rate of the volative precursor fluorinated compound and plasma composition.

The resulting parametrically modified high critical temperature superconducting material may then be harvested. That is, the parametrically modified high critical temperature superconducting material may be separated from the unmodified, subjacent low $T_c$ material. This separation may be accomplished by the use of ultrasound, abrasion, laser milling, or like technologies.

EXAMPLES

Samples of the defect oxide type of parametrically modified superconducting materials comprising metal species, oxygen, and fluorine in combined form were prepared to determine the effects of the method of incorporating the parametric modifier on the final electrical and structural properties of the superconducting material.

EXAMPLE I

One group of samples were prepared by blending fluorine containing precursors compounds with non-fluorinated precursor compounds. Specifically, the fluorinated and non-fluorinated precursor compounds were prepared by thoroughly mixing the following powders:

For the fluorine-free precursor material:

| Powder | Mass |
|---|---|
| $Y_2O_3$ | 1.513 gms |
| $BaCO_3$ | 5.284 gms |
| CuO | 3.198 gms |
| Total | 10.000 grams |
| | (80.42 millimoles) |

And for the fluorine-containing precursor material:

| Powder | Mass |
|---|---|
| $Y_2O_3$ | 1.513 gms. |
| $BaF_2$ | 4.704 gms. |
| CuO | 3.198 gms |
| Total | 9.415 grams. |
| | (80.42 millimoles) |

Each of the precursor materials was then heated separately, in air, at standard pressure, in a platinum crucible according to the following time-temperature program:

| Time | Temperature |
|---|---|
| 8 hours | 950 degrees Centigrade |
| 16 hours | 200 degrees Centigrade |

After the heating and cool-down process, the two precursor (fluorinated and non-fluorinated) materials were weighed and the following weight losses were observed. The 9.415 gram fluorine-containing precursor material lost 0.2233 grams (the loss believed to be primarily due to the evolution of $O_2$ and possibly fluorine gas), and the ten gram, fluorine-free precursor material lost 1.1204 grams (the large weight loss believed to be primarily due to the evolution of $CO_2$ and secondarily due to the evolution of $O_2$).

Five samples were then weighed out from combinations of the aforedescribed powdered precursor materials. Each of the samples were mixed so as to incorporate the following relative percentages of the precursor materials:

| Sample No. | Fluorinated | Non-Fluorinated |
|---|---|---|
| 1 | None | 100 percent |
| 2 | 0.410 gms. | 1.162 gms. |
| 3 | 0.820 gms. | 0.775 gms. |
| 4 | 1.229 gms. | 0.387 gms. |
| 5 | 100 percent | None |

Each of the five samples were then pressed into a pellet-like configuration measuring approximately 1 centimeter in diameter by approximately 3 millimeters in thickness. The five pellets were spacedly placed into a commercial grade alumina crucible in a such a manner that only opposed side wall edges of the pellets contacted the alumina walls of the crucible. The pellets were then fired in an oxygen furnace at standard pressure according to the following time-temperature program :

| Time | Temperature |
|---|---|
| 6 hours | Ramped from 200 degrees up to 950 degrees Centigrade |
| 48 hours | 950 degrees Centigrade |
| 6 hours | Ramped from 950 degrees Centigrade down to 200 degrees Centigrade in situ |

The five pellets were then removed from the alumina crucible, cut into a plurality of slices and the electrical properties thereof were measured. More particularly, each of the pellets was cut in a plane parallel to the upper and lower surfaces thereof and then multiple cuts were made in a direction perpendicular to that plane. The slices so formed were subjected to the aforementioned electrical measurements by affixing a single one of said slices to the end of an elongated four point contact probe, of the type well known to workers in the field of superconductivity, with the two intermediate contacts used for voltage measurement and the two remote contacts used for supplying current to the sample. The probe was lowered into a tank, the lower portion of which is filled with liquid helium. As should be apparent, when the probe is lowered into closer proximity to the liquid helium, the temperature of the pellet slice is moved closer to that of said helium, the temperature of the probe and sample being a function of both the vertical separation from the liquid helium and the residence time thereof in the tank. In this manner, changes in the potential placed across said slice as the temperature of the sample changes are measured. By closely monitoring the voltage and slowly changing the temperature of said sample, the zero resistance (superconducting) temperature of the sample can be accurately determined. Below the critical temperature, the critical currents are above 100 amperes per square centimeter.

It is in precisely this manner that the values of critical temperature were obtained.

The following results were obtained from selected slices of certain of the aforementioned pellet samples.

| Pellet Number | Transition Temperature Degrees K |
|---|---|
| 1 | 90K |
| 2 | 90K |
| 3-A | 92K |
| 3-B | 125K |
| 4 | None |
| 5 | None |

Electron microprobe and x-ray diffraction analyses of the pellets, showed the presence of detectable amounts of an additional (newly formed) non-superconducting phase, namely $BaF_2$, of the superconducting material. The instant inventors surmised that this additional phase was present because of the solid state reaction of the precursor compounds which were utilized to fabricate the superconducting material. More particularly, the barium, being a getter of fluorine, formed the barium fluoride phase preferentially to other of the high $T_c$ superconducting phases at the elevated temperatures being employed.

EXAMPLE II

A second group of samples was prepared to determine the effects of microwave plasma exchange of the labile atoms of the parametric modifier element, fluorine, for the constituent oxygen atom of the high $T_c$ phases of the superconducting material. The subject inventors further surmised that since the microwave plasma incorporation could be conducted at temperatures of about 450° C., no inter-metallic solid state reaction would occur and if the kinetics did not favor an inter-metallic solid state reaction, the $BaF_2$ phase (or other new non-superconducting phases) would not be formed.

The samples were prepared by blending the following non-fluorinated precursor materials in the following proportions:

| Powder | Mass |
|---|---|
| $Y_2O_3$ | 1.513 gms |
| $BaCO_3$ | 5.284 gms |
| CuO | 3.198 gms |
| Total | 10.000 grams (80.42 millimoles) |

The precursor materials were then thoroughly mixed and heated, in air, at standard pressure, in a platinum crucible according to the following time-temperature program:

| Time | Temperature |
|---|---|
| 8 hours | 950 degrees Centigrade |
| 16 hours | 200 degrees Centigrade |

After the heating and cool-down process, the precursor (non-fluorinated) materials were weighed and the following weight losses were observed. The fluorine-free precursor material lost 1.1204 grams (the large weight loss believed to be primarily due to the evolution of $CO_2$ and secondarily due to the evolution of $O_2$).

Each of the samples were then pressed into a pellet-like configuration measuring approximately 1 centimeter in diameter by approximately 3 millimeters in thickness. The pellets were spacedly positioned into a commercial grade alumina crucible in a such a manner that only opposed side wall edges of the pellets contacted the alumina walls of the crucible. The pellets were then fired in an oxygen furnace at standard pressure according to the following time-temperature program :

| Time | Temperature |
|---|---|
| 6 hours | Ramped from 200 degrees up to 950 degrees Centigrade |
| 48 hours | Maintained at 950 degrees Centigrade |
| 6 hours | Ramped from 950 degrees Centigrade down to 200 degrees Centigrade in situ |

After completion of the baking and cooling process, the pellets were placed in a dielectric carrier, face down. The carrier was then placed into a vacuum chamber operatively connected to have microwave radiation fed from a source into the interior thereof. The carrier was heated to 450° centigrade in an atmosphere of 14.7 psia oxygen for a time period of 30 minutes and then held at a constant temperature of 450° centigrade for an additional time period of 30 minutes. (Note that the sample was constantly subjected to oxygen atmosphere so as to avoid oxygen deprivation, by which deprivation mechanism the sample could lose oxygen and deleteriously affect the superconductive properties thereof). The oxygen flow was then cut off, and a vacuum of 250 microns was pulled. Argon was introduced into the vacuum chamber, a microwave plasma at a frequency of 2.45 GHz was initiated, and $NF_3$ (a gaseous precursor form of the parametric modifier) was introduced into the plasma. The microwave plasma was maintained for one hour, at a constant temperature of approximately 450 degrees Centigrade. The following flow rate ranges were maintained:

| $NF_3$ | 20-25 sccm |
|---|---|
| Ar | 110-124 sccm |

After one hour, the plasma was extinguished and the vacuum chamber was flooded with argon at 14.7 psia while the pellet were slowly cooled down to a temperature of less than 150° C. prior to removal from said chamber.

The peripheral surface area of the pellets exposed to the microwave plasma exhibited a fluorine concentration profile of about 30 atomic percent at the surface; which concentration was reduced to about 3 atomic percent at a 40 micron depth below the surface. Note that the concentration was less then one atomic percent of fluorine further into the bulk of the sample as measured from the exposed surface. The instant inventors conducted an electron microprobe analysis of the sample material so fabricated., which analysis clearly showed the replacement of oxygen by fluorine. Specifically, said analysis revealed that as the concentration of fluorine in the material increased, the concentration of oxygen decreased; and as the concentration of oxygen increased, the concentration of fluorine decreased.

Referring now to FIG. 3, there is illustrated a microphotograph of an approximately one hundred ten micron wide by eighty micron deep section of the sample of superconducting material fabricated by the aforementioned exchange technique of the subject invention.

In this particular sample, about at least 30 atomic percent of fluorine was exchanged for oxygen at the surface of the sample, which percentage was graded down to about 3 atomic percent of fluorine at a depth of about 60 microns below that surface. The fact that an exchange of labile fluorine atoms for constituent oxygen atoms had indeed occurred can be determined by noting the change in color (from a dark shade at the surface of the material to a relatively lighter and substantially white shade at the 60 micron depth below the surface). It is well known that the substantially white color is indicative of increasing oxygen content; and therefore, the lightening of the color relative to the diffusion of lesser percentages of fluorine with respect to depth clearly indicates progressively lesser ratios of fluorine relative to oxygen as the depth below the surface increases.

Further, the superconducting material so produced did not indicate the formation of a $BaF_2$ phase or the formation of any additional non-superconducting phases. The instant inventors believe this result demonstrates, up to the limits of the analytical equipment, that by employing a low temperature process for the introduction of labile atoms of the parametric modifier element, below the temperature at which a solid state reaction of the constituent metallic elements is thermodynamically favorable, it is possible to controllably exchange, large atomic percentages of labile atoms of the parametric modifier element for constituent oxygen elements without forming new non-superconducting phases of the superconducting material.

Again referring to FIG. 3, it is noteworthy that the large substantially white grains which are randomly interspersed throughout the bulk of the superconducting sample represent $Y_2Ba_1Cu_1O_5$ phases of the material. While this represents a non-superconducting phase of the sample, this "2,1,1" phase is present in greater volume fractions in conventionally fabricated $Y_1Ba_2Cu_3O_7$ samples. Therefore, this "2,1,1" phase has not been produced as a result of the exchange technique set forth hereinabove; and as a matter of fact, said exchange technique (as specified hereinafter) provides a method of controlling the volume fraction of said "2,1,1" phase. The only other identifiable non-superconducting phase illustrated in said microphotograph is found at the upper right-hand corner thereof and has been determined to represent a barium oxide phase, which barium oxide phase is preferentially formed during the solid state fabrication of the conventionally prepared "1,2,3" material; said preferential formation being due to the gettering capability of the barium which is released during the high temperature powder metallurgical processing.

Figure 2:
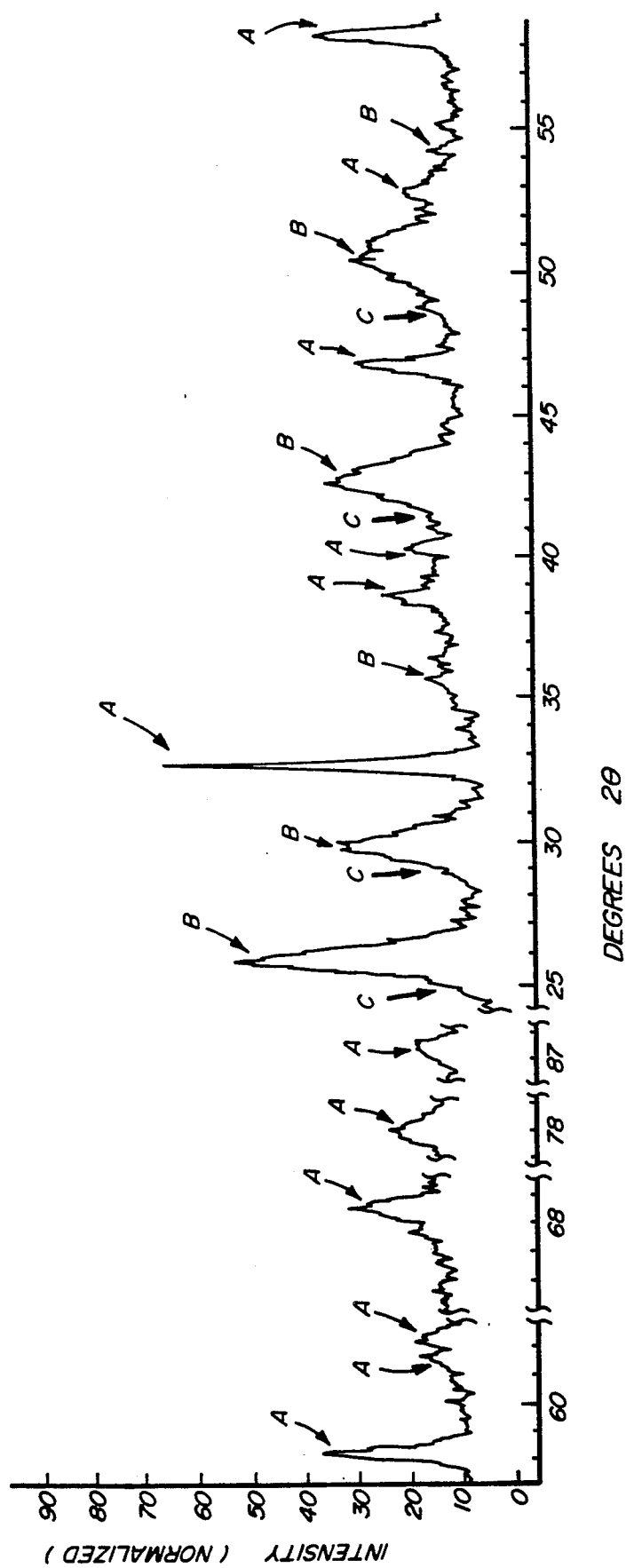
FIG. 2 is a graphic representation of intensity plotted on the ordinate versus Degrees Two Theta plotted on the abscissa, illustrating the absence of a non-superconducting $BaF_2$ phase when the superconducting material is fabricated according to the method of the instant invention.

Additional verification of the absence of the $BaF_2$ phase, as well as the substantial absence of other new non-superconducting phases (by utilizing the plasma exchange process of the instant invention) can be found from a perusal of FIG. 2. FIG. 2 is a graphical representation of the crystal structure of a sample prepared pursuant to the technique set forth in Example I, in which Intensity is plotted on the ordinate and Degrees Two Theta is plotted on the abscissa. The technique of x-ray diffraction is used to obtain the data plotted therein. This plot reveals the presence of only two major phases in the upper twenty microns of the superconducting sample which was fabricated with the profiled fluorine gradation, as mentioned hereinabove; the $Y_1Ba_2Cu_3O_{6.5\text{-}10}F\cdot 1\text{-}4$ superconducting phase represented by the reference letter A and the $Y_2Ba_1Cu_1O_5$ non-superconducting phase represented by the reference letter B. Note that the intensity (the height) of the peaks indicate the relative percentage of the particular phase present at the given angular position. Finally, arrows represented by the reference letter C indicate the angular position of the $BaF_2$ non-superconducting phase, if that phase was present in the sample being investigated. This angular position of the $BaF_2$ phase was determined by reference cards supplied by the manufacturer of the x-ray diffractometer as well as by the previous experience gained by the laboratory personnel at Energy Conversion Devices, Inc. in examining samples of ceramic defect oxide materials prepared by conventional powder metallurgical techniques.

It is based upon these electron microprobe and x-ray diffraction analyses that the instant inventors feel confident in stating that the fluorine for oxygen exchange method, described in detail hereinabove, provides a method by which fluorine atoms can be substituted for oxygen atoms already present in the unit cell of the superconducting material without the introduction of new non-superconducting phases. In this manner, the instant inventors hypothesize that the valence of the copper is moved into a more desirable oxidation state and, due to the extreme electronegativity of the fluorine atoms, that desired oxidation state is more firmly locked into a given lattice site.

Finally, the instant inventors have discovered that the volume percentage of the "2,1,1" non-superconducting phase of the superconducting material may be controlled during the course of the plasma exchange process previously described. More particularly, and referring to Example II described hereinabove, the instant inventors have introduced the volatile source of fluorinated feedstock gas, $NF_3$, at three different flow rates (1, 10, and 25 SCCM) so as to determine the affect of pressure on the diffusion and percent incorporation of labile fluorine atoms in the bulk of the "1,2,3" phase material. From these experiments, it was determined that an increase in the flow rate of $NF_3$ gas resulted in a substantially proportional increase in the volume percentage of the "2,1,1" phase present in the material. Conversely, a decrease in the flow rate of $NF_3$ gas resulted in a substantially proportional decrease in the volume percentage of the "2,1,1" phase present in the material. While a graphical representation of these results could extrapolate down to the total elimination of the "2,1,1" phase, the instant inventors have not as yet been able to totally eliminate said non-superconducting phase. However, it is important to note that the control of the flow of the parametric modifier containing gas provides a still further means of controlling the nature of the superconducting material formed by the novel exchange method of the subject invention.

While the invention has been described with respect to certain exemplification and embodiments thereof, it is not intended to limit the scope of the invention thereby, but solely by the claims appended hereto.

What is claimed is:

1. A method of introducing a parametric modifier into a ceramic defect oxide type material having stoichiometry represented by the formula $M^{IIA}M^{IIIA}M^{IB}O$; where $M^{IIA}$ is a Group IIA metal, which material includes at least one superconducting phase; said method including the steps of:

providing the ceramic defect oxide type material, said material including at least one superconducting phase;

subsequently subjecting said material to an atmosphere including labile fluorine atoms, said labile fluorine atoms adapted to be incorporated into the bulk of the material and diffusing said labile fluorine atoms a preselected depth into the bulk of the material to exchange fluorine atoms for oxygen atoms in the ceramic defect oxide type material, thereby forming at least one parametrically modified superconducting phase having stoichiometry represented by $M_v{}^{IIA}M_w{}^{IIIA}M_x{}^{IB}O_yZ_z$; where $M^{IIA}$ is a Group IIA metal, $M^{IIIA}$ is a Group IIIA metal, $M^{IB}$ is a Group IB metal, Z is fluorine, at a temperature below the solid state reaction temperature of the constituent metallic elements so as to prevent the formation of new non-superconducting phases.

2. A method as in claim 1, including the further step of decomposing a fluorine compound so as to provide said source of labile atoms.

3. A method as in claim 1, including the further step of decomposing said fluorine compound in a glow discharge plasma.

4. A method as in claim 3, including the further step of decomposing said fluorine in a microwave plasma.

5. A method as in claim 4, including the further step of introducing a fluorine compound in volatile form.

6. A method as in claim 5, including the further step of introducing $NF_3$ as the fluorine compound.

7. A method as in claim 2, including the further step of utilizing a catalyst to decompose said fluorine compound.

8. A method as in claim 1, including the further step of grading the concentration of said flourine from a maximum at the surface of said superconducting material to a preselected minimum internally thereof.

9. A method as in claim 8, including the further step of harvesting the high critical temperature superconducducting phase of the superconducting material.

10. A method as in claim 1, including the further step of grading the concentration of labile flourine atoms so as to be constant throughout the bulk of the high temperature superconducting phase.

* * * * *